United States Patent
Blair et al.

(10) Patent No.: US 9,065,384 B1
(45) Date of Patent: Jun. 23, 2015

(54) AMPLIFIER AND SWITCH CONFIGURED AS MULTIPLEXOR

(71) Applicant: ESS Technology, Inc., Fremont, CA (US)

(72) Inventors: Robert L. Blair, Pleasanton, CA (US); Hu Jing Yao, Kelowna (CA); Dustin Dale Forman, Kelowna (CA); A. Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 14/482,962

(22) Filed: Sep. 10, 2014

Related U.S. Application Data

(60) Provisional application No. 62/027,749, filed on Jul. 22, 2014.

(51) Int. Cl.
- *H03F 99/00* (2009.01)
- *G06F 17/00* (2006.01)
- *H03F 1/00* (2006.01)

(52) U.S. Cl.
CPC .................................... *H03F 1/00* (2013.01)

(58) Field of Classification Search
USPC ............. 381/120, 121, 300, 108, 318, 97, 85, 381/77, 94.5, 94.7, 11; 348/738, 632, 468
See application file for complete search history.

(56) References Cited

U.S. PATENT DOCUMENTS

| | | | | |
|---|---|---|---|---|
| 7,558,529 | B2* | 7/2009 | Seshadri et al. | 455/41.2 |
| 8,275,307 | B2* | 9/2012 | Doyle, III | 455/3.06 |
| 2002/0098878 | A1* | 7/2002 | Mooney et al. | 455/569 |
| 2003/0009750 | A1* | 1/2003 | Hundt et al. | 717/154 |
| 2005/0192687 | A1* | 9/2005 | Lee et al. | 700/94 |
| 2007/0030400 | A1* | 2/2007 | Gil | 348/738 |
| 2007/0127747 | A1* | 6/2007 | Doyle | 381/309 |
| 2011/0019107 | A1* | 1/2011 | Lowe et al. | 348/738 |

* cited by examiner

*Primary Examiner* — Davetta W Goins
*Assistant Examiner* — Kuassi Ganmavo
(74) *Attorney, Agent, or Firm* — Gard & Kaslow LLP

(57) ABSTRACT

A system and method is disclosed for selecting between two electronic signals, one of high quality, such as music audio, and the other of low quality, such as telephone call audio, in a smart phone, tablet or other device. In one embodiment, when the low quality signal is to be used this is accomplished by disabling the amplifier output to disconnect the high quality audio signal from the output port, rather than by means of a switch between the amplifier and the output port as in the prior art. This eliminates degradation of the signal due to the switch when the high quality signal is to be used. The amplifier typically has an associated feedback resistor network, and this may also be disconnected by means of a switch when the low quality signal is to be used, thus preventing distortion of the low quality signal due to the feedback network being a parallel load to the output port.

6 Claims, 4 Drawing Sheets

AMPLIFIER AND SWITCH CONFIGURED AS MULTIPLEXOR

This application claims priority from Provisional Application No. 62/027,749, filed Jul. 22, 2014, which is incorporated by reference herein in its entirety.

FIELD OF THE INVENTION

The present invention relates generally to electronic signals, and more particularly to an apparatus used to switch between received electronic signals.

BACKGROUND OF THE INVENTION

There are a number of applications in which two or more signals are provided or received by some electronic device, and it becomes necessary to select one of those signals as an output signal. For example, in a typical smart phone, tablet or other device that is capable of functioning as a cellular telephone, an audio and video player, an internet web browser, etc., a user may be listening to music or watching and listening to a video (either stored in the device or streamed from a website, for example) when a telephone call is received.

In such a case it is desirable to pause the music or video or otherwise discontinue listening to and/or watching it, and to instead accept and respond to the telephone call. Thus, the audio of the music or video must be replaced by the audio of the telephone call as the output presented to the user. This is commonly done by means of switches which route the desired signal to the audio output of the smart phone, so that the user may hear the telephone call from the smart phone speaker or headphones connected to the smart phone.

Typically the audio provided by the music player portion of a smart phone will be of a higher sound quality than the audio provided by the cellular telephone portion of the smart phone. Thus, there will typically be a low-quality codec for the telephone audio, as a telephone call is a signal having a low bandwidth and thus resulting in low quality audio, and a higher quality codec for music and for the audio portion associated with at least some video, such as movies.

The low quality codec will also process other low quality signals that may, for example, include only voice audio, such as synthesized voice commands, navigation directions, of the output of "read aloud" applications, and there may similarly be situations where it desirable to switch from the high quality audio to one of these low quality audio signals. The low quality codec typically requires less power than the high quality codec, and thus is used for low quality audio to conserve power and extend battery life of the device. In some instances, the user or the system may choose to have all audio processed by the low quality codec, for example if the device is close to shutting down due to a low power level.

A typical circuit 100 for accomplishing this change of output, such as may be found in a smart phone or tablet, is shown in FIG. 1. In FIG. 1 it is assumed that the low quality telephone audio is received at circuit 100 from the low quality codec (not shown) as Alternate input, and the high quality music or audio portion of a video is received from the high-quality codec (not shown) at the input port having terminals IN− and IN+. The high quality audio is then amplified by an amplifier circuit 102 which, as is known in the art, includes an amplifier 104 and a feedback network consisting of resistors 106. In order to provide a high quality audio output that maintains the audio quality provided by the high quality codec, amplifier 104 is preferably a high performance and low distortion amplifier. (While only one amplifier circuit 102 is shown, there are typically two such circuits for stereo applications, for right and left channels.)

A selection circuit (not shown) generates a signal Select which is used to direct one audio stream or the other to the output port Out, and to switch from one signal to the other at the appropriate time. Which audio stream is selected is typically a function of which application is being run on the device. In circuit 100, signal Select operates switches S1 and S2 to switch the signals provided to the output port Out. Switch S1 operates to feed the high quality music audio from amplifier circuit 102 to Out, while switch S2 operates to feed the low quality telephone call audio to Out. Again, the user may receive the audio output Out either from a speaker in the smart phone or through an attached speaker, such as headphones.

When the user activates the music player or other high quality music source, Select determines the positions of the switches; switch S1 is closed, connecting amplifier circuit 102 to Out, while switch S2 is opened so that no audio from the telephone circuit is provided to Out. When a telephone call is received and the user indicates that the telephone call is to be answered, Select causes switch S1 to be opened, removing the music stream from Out, while switch S2 is closed, providing the telephone call audio to Out.

However, switch S1 is of course an electronic component, and degrades the audio signal that passes through it, and circuit 100 may not perform as well as expected or desired due to the presence of switch S1. It is thus desirable to find a solution for this switching problem which does not require a switch between the amplifier of the high quality audio signal (here amplifier 104) and the output port (here Out).

SUMMARY OF THE INVENTION

A method and system is disclosed for selecting between two electronic signals, one of high quality, such as music audio, and the other of low quality, such as telephone call audio, in a smart phone, tablet or other device.

One embodiment discloses a circuit, comprising: a first input port for receiving a high quality audio signal; an amplifier circuit, connected to the first input port, for receiving and amplifying the high quality audio signal, the amplifier circuit comprising an amplifier and a feedback network and receiving a control signal indicating if the amplified signal is to be output; a second input port for receiving a low quality audio signal; an output port connected directly to the amplifier; a first switch connecting the second input port to the output port; and a third port for receiving a selection signal indicating which audio signal is to be present at the output port, the third port connected to the amplifier circuit and the first switch such that: if the high quality audio signal is selected, sending the selection signal to the amplifier circuit as the control signal thereby causing the amplifier circuit to output the amplified signal, and sending the selection signal to the first switch thereby causing the first switch to open; and if the low quality audio signal is selected, sending the selection signal to the amplifier circuit as the control signal thereby causing the amplifier circuit to not output the amplified signal, and sending the selection signal to the first switch thereby causing the first switch to close.

DETAILED DESCRIPTION OF THE INVENTION

Described herein is a system and method for switching between two electronic signals, such as music audio and telephone call audio in a smart phone, tablet or other device.

Figure 1:
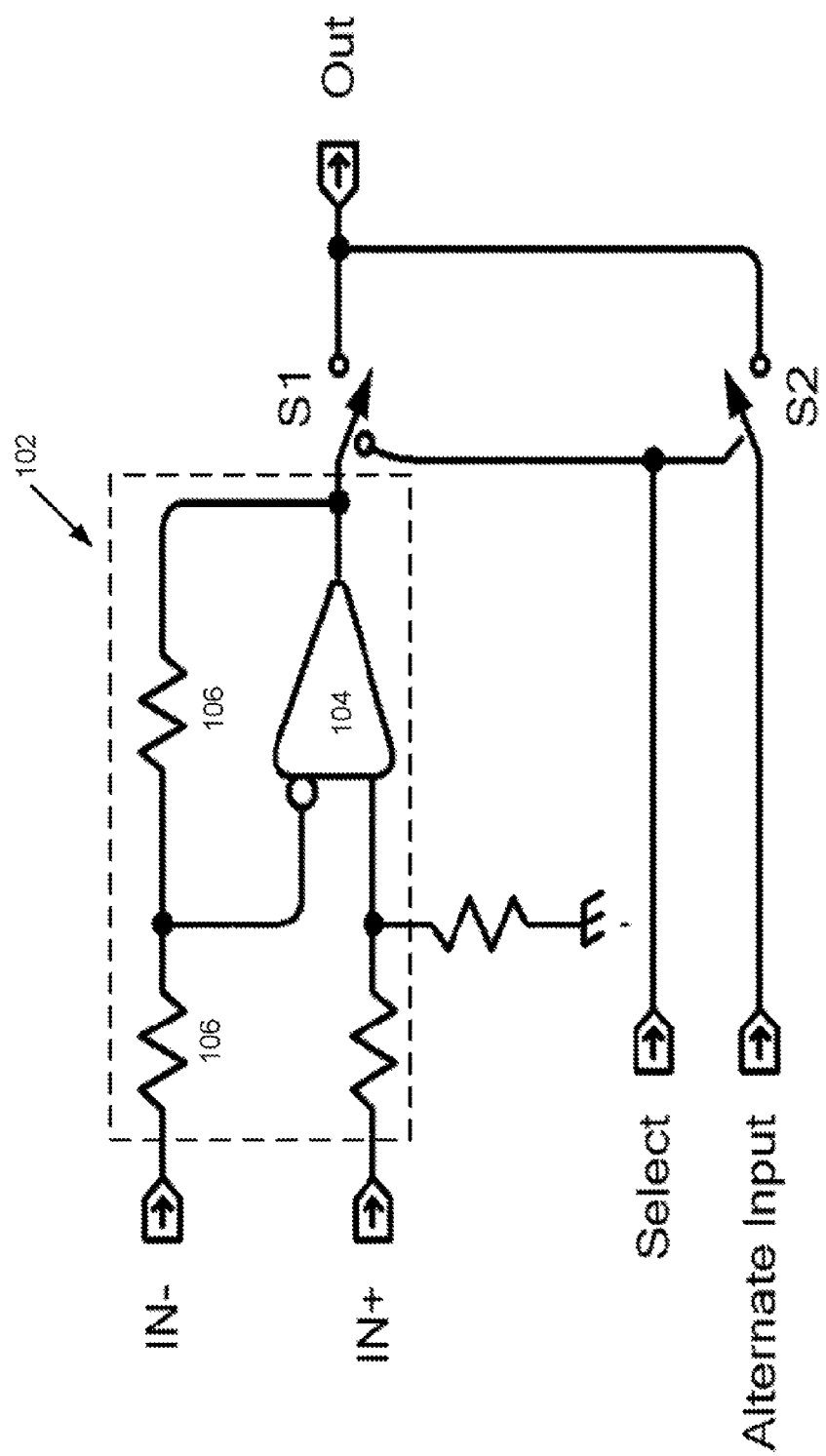
FIG. 1 is a block diagram of a typical prior art circuit that might be contained in a smart phone for switching between music audio and telephone call audio.

As above, it is desirable to find a way to remove switch S1 from circuit 100 of FIG. 1 so as to eliminate the distortion of the high quality audio signal from amplifier 104 that is introduced by the presence of S1. It is further desirable to do so without introducing any other distortion or artifacts to the high quality audio signal, or to the low quality audio signal received at Alternate Input.

In one embodiment, this is accomplished by disconnecting the high quality audio signal from the output port not by means of a switch in the path, as in circuit 100 of FIG. 1, but rather by the use of a signal which enables or disables the output of the amplifier amplifying the high quality audio as appropriate; when the signal does not enable the amplifier output, the amplifier is placed into a high impedance state. If desired, the resistor network associated with the amplifier may also be disconnected by means of a switch.

Figure 2:
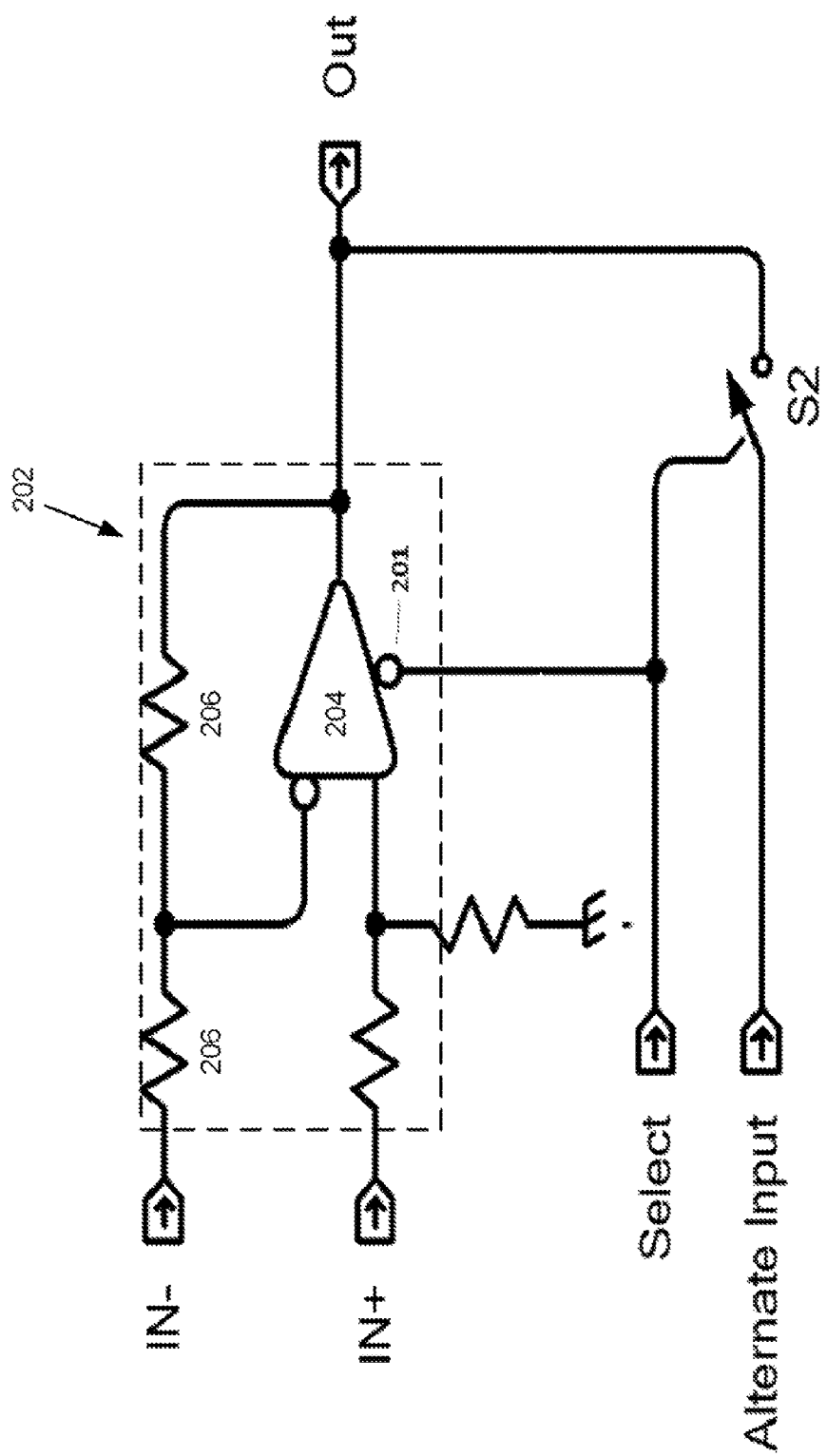
FIG. 2 is a block diagram of a circuit that might be used in a smart phone for switching between music audio and telephone call audio according to one embodiment.

One such circuit providing a solution to the problem of degradation of the high quality audio signal produced by a high performance amplifier due to the presence of a switch in the signal path is shown in FIG. 2. In circuit 200, the need for a switch in the path between the high performance amplifier and the output port, such as switch S1 in FIG. 1, is avoided. This is done by enabling the amplifier output when the high quality audio signal is desired, and disabling the amplifier output when another output is desired, rather than switching away from the amplifier output as in FIG. 1.

As with circuit 100 of FIG. 1, circuit 200 of FIG. 2 receives low quality audio, such as telephone audio, from a low quality codec at Alternate Input, and high quality audio, such as music or the audio portion of a video, from a high-quality codec at the inputs IN− and IN+. The high quality audio is again amplified by an amplifier circuit 202, which includes a high performance amplifier 204 and a feedback network including resistors 206. The user may again receive the audio stream from output port Out either from a speaker in the smart phone or through an attached speaker, such as headphones.

In circuit 200, there is no switch between the amplifier 204 and the output port Out, such as switch S1 in circuit 100 of FIG. 1. Rather, the output of amplifier is connected directly to Out, thus providing an advantage over circuit 100 in that the high quality audio amplified by amplifier 204 is not compromised by such a switch. However, since only one audio stream should be presented to Out at a given moment, the output from amplifier 204 must not be fed to Out when another audio stream from Alternate Input is selected.

In the absence of such a switch in the path controlling when audio is passed from amplifier 204 to Out, this is accomplished by disabling the amplifier's output, so that the high quality audio input at IN+ and IN− is not amplified and the high quality audio thus does not reach Out. (It is also possible to cause that input signal at IN+ and IN− to go into a quiescent state, but this is not essential.)

In circuit 200 of FIG. 2, this is again accomplished by use of the signal Select, in a somewhat similar fashion to that of circuit 100 of FIG. 1. In circuit 200, as in circuit 100, the signal Select again causes switch S2 to be open when music of other high quality audio is being provided to the output port Out by amplifier 204, acts as control signal 201 which enables the output of amplifier 204, and closes switch S2 to feed the low quality audio from Alternate Input, such as telephone call audio, to Out when a telephone call is received, so that the user may receive the telephone audio rather than the high quality audio from amplifier 104.

Now, however, in the absence of a switch between the amplifier 204 and Out, such as switch S1 in circuit 100 which controls when audio is passed from amplifier 104 to Out, the signal Select also changes the value of control signal 201 to the amplifier 204 to disable the amplifier's output so that the high quality audio input at IN+ and IN− is not amplified and the high quality audio thus does not reach Out. With Switch S2 closed and no output from amplifier 204, only the telephone audio received at Alternate Input is passed to the output port Out and the user receives the telephone audio from that port as above.

Some examples of amplifiers that accept a control signal as described include models AD4898, AD8038 and AD8591 from Analog Devices, Inc., although such amplifiers may not be designed specifically for audio use. The wording used by Analog Devices' literature for the control signal differs by device; in the case of the AD4898, the phrase "power down" is used, while for the AD8591 the phrase "shut down" is used and for the AD8038 it is called "disable." In addition, in the AD8038 the control signal enables the amplifier output when the control signal is low, while the AD4898 and AD8591 enable the amplifier output when the control signal is high. However, in each of these models, when the amplifier is not enabled it goes to a high impedance state due to the output devices of the amplifier being shut off.

It will be noted that in FIG. 2 as illustrated, the output of amplifier 204 is disabled, and switch S2 is closed, when signal Select is low. However, it will be apparent to one of skill in the art that if an amplifier is selected in which the output is disabled when the control signal is high, then switch S2 should also be closed when Select is high.

Although amplifier 204 will not amplify the high quality audio when it is disabled by the signal Select, when this is done the components of the feedback path of the amplifier, i.e., resistors 206, remain in place as part of the resulting circuit. Specifically, the resistors 206 are now seen as being in parallel with the load of output Out. This changes the effective resistive load of the output, and will cause distortion in the output from what is intended or expected from the codec providing the audio at Alternate Input.

Depending upon the size of the resistors compared to the load of the output, this distortion may be minimal or acceptable, given that the audio signal at Alternate Input, such as telephone audio, is of low quality in any event. In some cases, however, such distortion is undesirable and thus it may be advantageous to remove it if possible.

Figure 3:
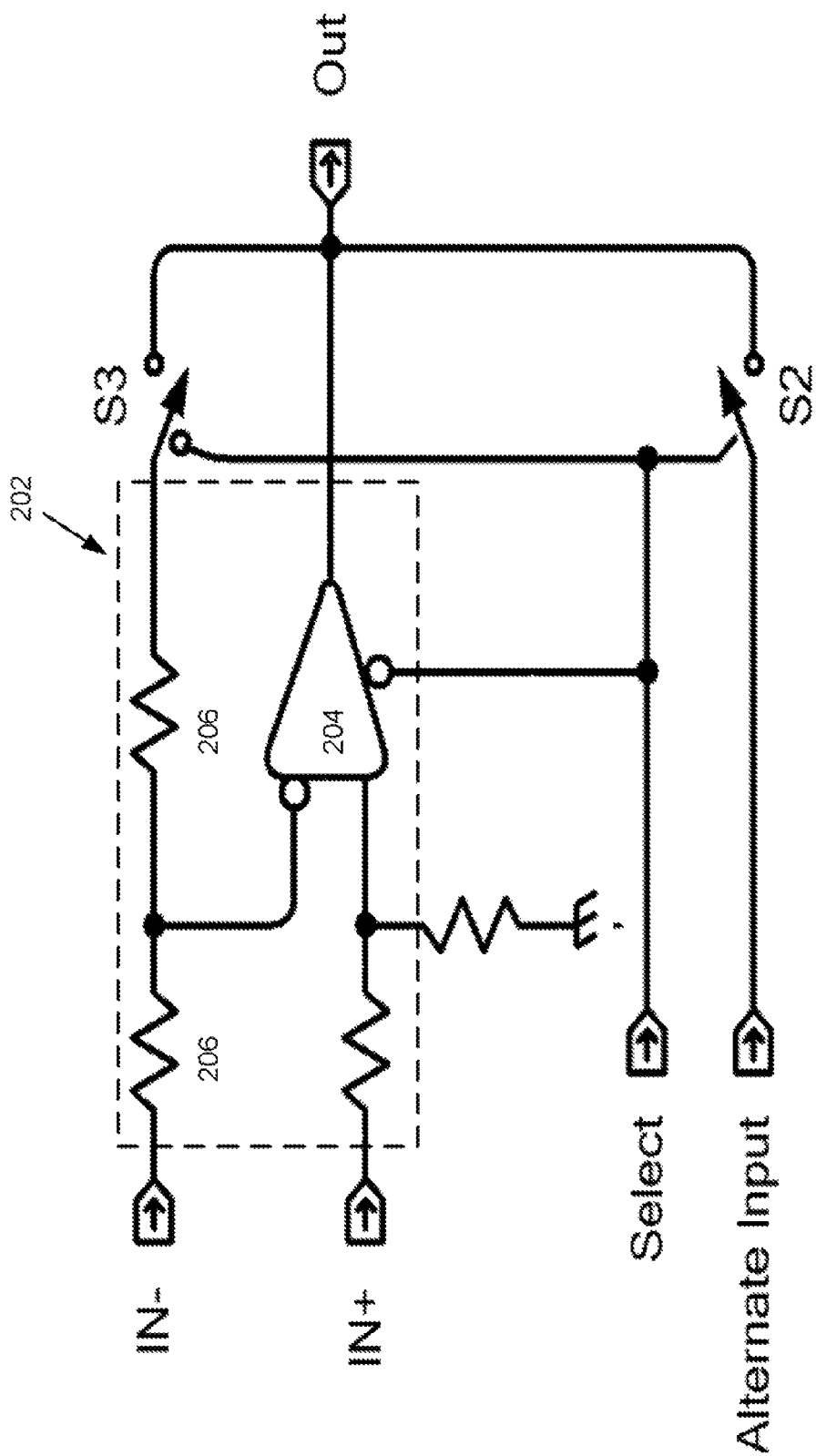
FIG. 3 is a block diagram of a circuit that might be used in a smart phone for switching between music audio and telephone call audio according to another embodiment.

FIG. 3 shows a circuit 300 which improves upon circuit 200 of FIG. 2 by allowing the feedback network of the amplifier to be effectively removed from the circuit when the amplifier is disabled. In circuit 300, as in circuit 200 in FIG. 2, input ports IN+ and IN− receive a high quality audio signal, and input port Alternate Input receives a low quality audio signal. Amplifier circuit 202 again includes high performance amplifier 204 and resistors 206, and amplifies the high quality audio signal when amplifier 204 is enabled by control signal 201, i.e. signal Select, and provides the amplified high quality audio signal to the output port Out.

Also as in circuit 200, in circuit 300 when the signal Select closes switch S2 when audio such as telephone audio is received at Alternate Input, it also changes control signal 201 to amplifier 204 to disable the output of amplifier 204, so that only the audio received at Alternate Input appears at Out and not the audio received at IN+ and IN−.

In addition to switch S2, unlike circuit 200 of FIG. 2, circuit 300 contains a second switch, switch S3. However, unlike switch S1 in circuit 100 of FIG. 1, in circuit 300 switch S3 is not between amplifier 204 and Out, but rather is between resistors 206 and Out. When audio input at Alternate Input is to be provided to Out, in addition to closing switch S2 and disabling amplifier 104, the signal Select also opens switch S3, thus isolating the feedback network of amplifier circuit 202, i.e., resistors 206.

When switch S2 is dosed and switch S3 is open, and the output of amplifier 104 disabled, the resistors 206 of amplifier circuit 202 are removed from the resulting effective circuit. Now there is no additional resistive load from resistors 206 in parallel with the load of output port Out, and the audio from Alternate Input may be passed to Out without further distortion.

It is apparent that circuit 300 of FIG. 3 again has two switches, as does circuit 100 of FIG. 1, also includes control signal 201 to disable amplifier 204 in signal Select, and is thus in some small sense more complex than circuit 100. However, circuit 300 still has a significant advantage over circuit 100. Although it may appear that circuit 300 has merely moved switch S1 in circuit 100 to a new position, i.e., switch S3 in circuit 300, switches S1 and S3 require very different capabilities.

Switch S1 in circuit 100 must handle a high quality signal from amplifier 104, for example a signal varying by 100 decibels (db) and driving a low impedance load, such as headphones having a resistance of 8 ohms, and thus switch S1 must be able to handle a substantial current. On the other hand, switch S3 may be a switch of much lower quality and thus cost, as it merely needs to handle the much lower current needed to drive the amplifier feedback network, which may be on the order of 1000 ohms.

Further, circuit 300 still has the same advantage over circuit 100 as does circuit 200 of FIG. 2, i.e., circuit 300 has no switch between amplifier 204 and output port Out to distort the high quality audio signal. And in addition, circuit 300 has the advantage over circuit 200 that when audio from Alternate Input is fed to Out, there is no distortion due to the presence of the feedback network of amplifier circuit 202, i.e., resistors 206.

Figure 4:
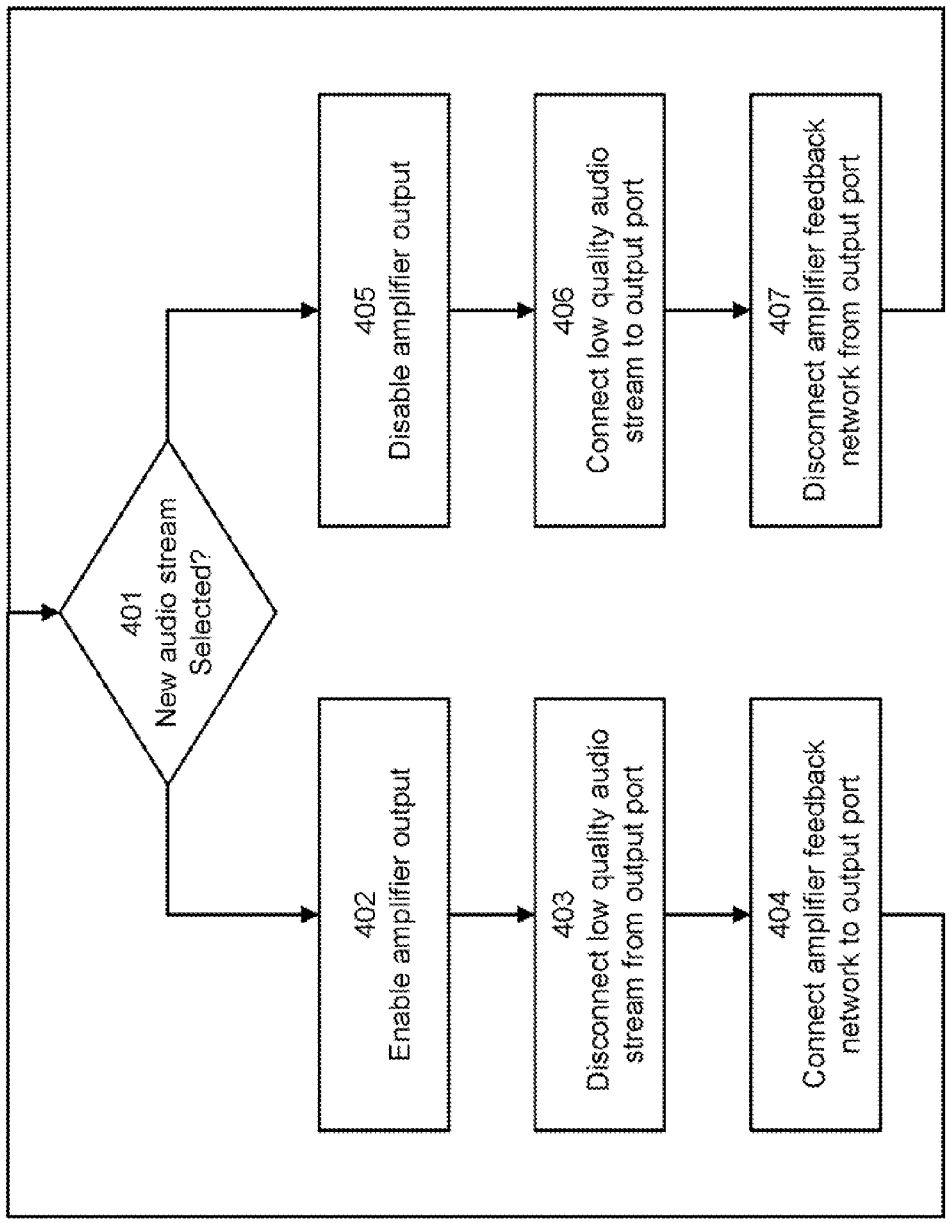
FIG. 4 is a flowchart of a method of switching between two electronic signals according to one embodiment.

FIG. 4 shows a flowchart of a method of operation of a circuit such as circuit 200 of FIG. 2 or circuit 300 of FIG. 3. As illustrated here, it is assumed that a user is using a smart phone, tablet or other device which is capable of providing two separate audio streams, one of high quality, such as music audio or audio accompanying a video such as a movie, and one of low quality such as telephone audio.

At step 401, an audio stream is selected, either the high quality audio stream or the low quality audio stream. Which audio stream is selected is typically a function of which application is being used, and the audio stream is thus indirectly selected by the user. For example, the user may select the music player or video player application, and the music or video player will enable the high quality audio stream, or the user may select the telephone function to make or answer a call, and the telephone function will enable the low quality audio stream.

If the user selects an application that enables the high quality audio stream, which as above will typically come from a high quality codec, several steps occur to enable the high quality audio stream to be passed to the output port, from which the user may receive the audio stream from a speaker or headphones. In the circuits 200 and 300, this is accomplished by the signal Select causing the circuit to perform several steps.

At step 402, the amplifier is enabled so that the high quality audio signal may be amplified and passed from the amplifier to the output port. At step 403, a switch which connects the other, low quality, audio stream to the output port is opened so that the low quality audio stream is disconnected from the output port. At step 404, a switch which connects the feedback network of the amplifier is closed, connecting the feedback network to the output port. (As above, in some embodiments, the feedback network will remain connected to the output port in all instances, and step 404 may thus be omitted in those embodiments.) Steps 402 to 404 may occur in any sequence, or may be simultaneous.

When a low quality audio stream is selected at step 401, several steps will also occur, which are essentially the reverse of the steps taken when the high quality audio stream is selected. Again, in the circuits 200 and 300, this results in the device using the signal Select to perform these steps.

At step 405, the amplifier is disabled so that the high quality audio signal will not amplified, and thus will not be passed from the amplifier to the output port. At step 406, the switch which connects the other, low quality, audio stream to the output port is closed so that the low quality audio stream is connected to the output port. At step 407, a switch which connects the feedback network of the amplifier is opened, disconnecting the feedback network to the output port. (Again, in some embodiments, the feedback network will remain connected to the output port in all instances, and step 407 will again be omitted, along with step 404, in those embodiments.) Again, steps 405 to 407 may occur in any sequence, or simultaneously.

Once activated, the connection of an audio stream to the output port will continue until either some event indicates that a switch to the other audio stream should take place, or the application providing the audio stream terminates. In some cases only a single audio stream will be activated. For example, a user may activate the music player or video player, and then stop the player at any time, regardless of whether a telephone call has been received; in such a case, the high quality audio stream will be activated, and the device will not switch to a low quality audio stream. Similarly, a user may make or receive a telephone call, activating a low quality audio stream without having activated a high quality audio stream. In such cases, the audio stream ceases when the application activating the audio stream is turned off or shuts off.

However, in other cases, the device may switch from one audio stream to the other due to the applications in use. For example, some smart phones have the capability of pausing an application when a telephone call is received. Thus, a user who receives a telephone call while listening to a high quality audio stream and/or watching a video may use an appropriate action to answer the call, causing the smart phone to switch from the high quality audio stream to the telephone audio stream as above, while also causing the music or video player to pause while the user is using the telephone. Once the user ends the telephone call, the music of video player may automatically resume at the point at which play was paused, and the high quality audio stream resume without the user having to again select the music or video player.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, it is expected that the described method and apparatus may be used with other amplifier configurations, including those with a virtual ground, positive gain, etc. In addition to smart phones, the described method and apparatus may also be applicable to other mobile devices such as tablets or laptops, or even to stationary devices such as desktop computers, television set top boxes, etc. Any device which is capable of outputting both a high quality audio stream and a low quality audio stream may benefit from the described invention.

In addition, while it is believed that in general the audio stream will be selected based upon the application in use, it is possible that in some embodiments the audio stream may be selected specifically by a user, or by some function of the system operating on the device in question.

It should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc. It may be possible to incorporate the described methods into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A circuit comprising:
   a first input port for receiving a high quality audio signal;
   an amplifier circuit, connected to the first input port, for receiving and amplifying the high quality audio signal, the amplifier circuit comprising an amplifier and a feedback network and receiving a control signal indicating if the amplified signal is to be output;
   a second input port for receiving a low quality audio signal;
   an output port connected directly to the amplifier;
   a first switch connecting the second input port to the output port; and
   a third input port for receiving a selection signal indicating which audio signal is selected to be present at the output port, the third input port connected to the amplifier circuit and the first switch such that:
   if the high quality audio signal is selected, sending the selection signal to the amplifier circuit as the control signal thereby causing the amplifier circuit to output the amplified high quality audio signal, and sending the selection signal to the first switch thereby causing the first switch to open; and
   if the low quality audio signal is selected, sending the selection signal to the amplifier circuit as the control signal thereby causing the amplifier circuit to not output the amplified high quality audio signal, and sending the selection signal to the first switch thereby causing the first switch to close.

2. The circuit of claim 1 further comprising a second switch connected to the third port and connecting the feedback network to the output port, and wherein the selection signal is further sent to the second switch thereby causing the second switch to close when the high quality audio signal is selected and causing the second switch to open when the low quality audio signal is selected.

3. A circuit comprising:
   a first input port for receiving a high quality audio signal;
   an amplifier circuit, connected to the first input port, for receiving the high quality audio signal, the amplifier circuit comprising an amplifier and a feedback network and receiving a control signal which causes the amplifier to produce either an amplified high quality audio signal or no signal;
   a second input port for receiving a low quality audio signal;
   an output port connected directly to the amplifier;
   a first switch connecting the second input port to the output port such that the low quality signal is passed to the output when the first switch is closed and not passed to the output when the first switch is open; and
   a third input port for receiving a selection signal indicating that the low quality audio signal is to be present at the output port, the third input port connected to the amplifier and the first switch, the selection signal closing the first switch, so that the low quality audio signal is passed to the output, and the selection signal acting as the control signal causing the amplifier to produce no signal.

4. The circuit of claim 3 further comprising a second switch connecting the feedback network to the output port when the second switch is closed, and connected to the third input port, the selection signal further opening the second switch so that the feedback network is disconnected from the output port.

5. The circuit of claim 3 further comprising a second switch connecting the feedback network to the output port when the second switch is closed, and connected to the third input port, the selection signal further closing the second switch so that the feedback network is connected to the output port.

6. A circuit comprising:
   a first input port for receiving a high quality audio signal;
   an amplifier circuit, connected to the first input port, for receiving the high quality audio signal, the amplifier circuit comprising an amplifier and a feedback network and receiving a control signal which causes the amplifier to produce either an amplified high quality audio signal or no signal;
   a second input port for receiving a low quality audio signal;
   an output port connected directly to the amplifier;
   a first switch connecting the second input port to the output port such that the low quality signal is passed to the output when the first switch is closed and not passed to the output when the first switch is open; and
   a third input port for receiving a selection signal indicating that the amplified high quality audio signal is to be present at the output port, the third input port connected to the amplifier and the first switch, the selection signal opening the first switch, so that the low quality audio signal is not passed to the output, and the selection signal acting as the control signal causing the amplifier to produce an amplified high quality audio signal.

* * * * *